(12) United States Patent
Nakamura

(10) Patent No.: US 12,186,857 B2
(45) Date of Patent: Jan. 7, 2025

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 506 days.

(21) Appl. No.: 17/453,025

(22) Filed: Nov. 1, 2021

(65) Prior Publication Data

US 2022/0161384 A1    May 26, 2022

(30) Foreign Application Priority Data

Nov. 20, 2020    (JP) .................................. 2020-193284

(51) Int. Cl.
*H01L 21/78*    (2006.01)
*B24B 7/22*    (2006.01)

(52) U.S. Cl.
CPC .............. *B24B 7/228* (2013.01); *H01L 21/78* (2013.01)

(58) Field of Classification Search
None
See application file for complete search history.

(56) References Cited

U.S. PATENT DOCUMENTS

2006/0148211 A1*  7/2006  Iwasaki .................. H01L 21/78
                                                                257/E21.599
2009/0314144 A1* 12/2009  Iri ........................... B28D 5/022
                                                                83/13

FOREIGN PATENT DOCUMENTS

JP          11176772 A        7/1999

* cited by examiner

*Primary Examiner* — Cory W Eskridge
(74) *Attorney, Agent, or Firm* — GREER BURNS & CRAIN, LTD.

(57) ABSTRACT

A wafer processing method includes a holding step of holding a wafer on a chuck table; a dressing step of cutting a peripheral marginal area of the wafer by a cutting blade mounted to a cutting unit to condition a state of a cutting edge; and a dividing step of cutting streets by the cutting blade mounted to the cutting unit to divide the wafer into individual device chips.

19 Claims, 3 Drawing Sheets

WAFER PROCESSING METHOD

BACKGROUND OF THE INVENTION

Field of the Invention

The present invention relates to a wafer processing method for dividing a wafer into individual device chips.

Description of the Related Art

A wafer formed on a front surface thereof with a plurality of devices such as integrated circuits (ICs) and large-scale-integration (LSI) circuits partitioned by a plurality of intersecting streets is divided by a cutting apparatus including a cutting blade into individual device chips, and the divided device chips are used for electric apparatuses such as mobile phones and personal computers.

The cutting apparatus includes a chuck table that holds a wafer; a cutting unit to which a cutting blade provided at a periphery thereof with a cutting edge for cutting the wafer held by the chuck table is rotatably mounted; an X-axis feeding mechanism that puts the chuck table and the cutting unit into relative processing feeding in an X-axis direction; a Y-axis feeding mechanism that puts the chuck table and the cutting unit into relative indexing feeding in a Y-axis direction orthogonal to the X-axis direction; and a Z-axis feeding mechanism that puts the cutting unit into cutting-in feeding in a Z-axis direction orthogonal to the X-axis direction and the Y-axis direction, and can divide the wafer into individual device chips with high accuracy.

In addition, in order to condition a state of the cutting edge of the cutting blade, dressing including dressing and removal of deposited matter by holding a wafer not formed with devices (dummy wafer) on a chuck table and cutting the dummy wafer by a cutting blade to condition the state of a cutting edge is conducted periodically or at any timing (see, for example, Japanese Patent Laid-Open No. Hei 11-176772).

SUMMARY OF THE INVENTION

In order to perform the dressing described above, the dummy wafer not formed with devices must separately be prepared, and a new dummy wafer is required when dressing is conducted a predetermined number of times, which is uneconomical. In addition, since dressing is conducted by re-placing the dummy wafer on the chuck table, there is a problem of worsening of productivity.

Accordingly, it is an object of the present invention to provide a wafer processing method which eliminates the need to separately prepare a dummy wafer and the need to re-place the wafer, even in the case where a dressing step for conditioning the state of a cutting edge is needed.

In accordance with an aspect of the present invention, there is provided a wafer processing method for dividing a wafer formed on a front surface thereof with a device area in which a plurality of devices are partitioned by a plurality of intersecting streets and a peripheral marginal area surrounding the device area into individual device chips. The wafer processing method includes a preparing step of preparing a cutting apparatus including a chuck table that holds the wafer, a cutting unit to which a cutting blade provided at a periphery thereof with a cutting edge for cutting the wafer held by the chuck table is rotatably mounted, an X-axis feeding mechanism that puts the chuck table and the cutting unit into relative processing feeding in an X-axis direction, a Y-axis feeding mechanism that puts the chuck table and the cutting unit into relative indexing feeding in a Y-axis direction orthogonal to the X-axis direction, and a Z-axis feeding mechanism that puts the cutting unit into cutting-in feeding in a Z-axis direction orthogonal to the X-axis direction and the Y-axis direction; a holding step of holding the wafer on the chuck table; a dressing step of cutting the peripheral marginal area by the cutting blade mounted to the cutting unit, to condition a state of the cutting edge, after the holding step is carried out; and a dividing step of cutting the streets by the cutting blade mounted to the cutting unit, to divide the wafer into the individual device chips.

Preferably, in the dressing step, the cutting unit is put into cutting-in feeding in the Z-axis direction to vertically cut into the peripheral marginal area, thereby conditioning the cutting edge of the cutting blade.

According to the present invention, in the wafer processing method, even in the case where a dressing step for conditioning the state of the cutting edge is needed, it is unnecessary to prepare a dummy wafer, and it is unnecessary to re-place the wafer due to carrying out of the dressing step, so that productivity is enhanced.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
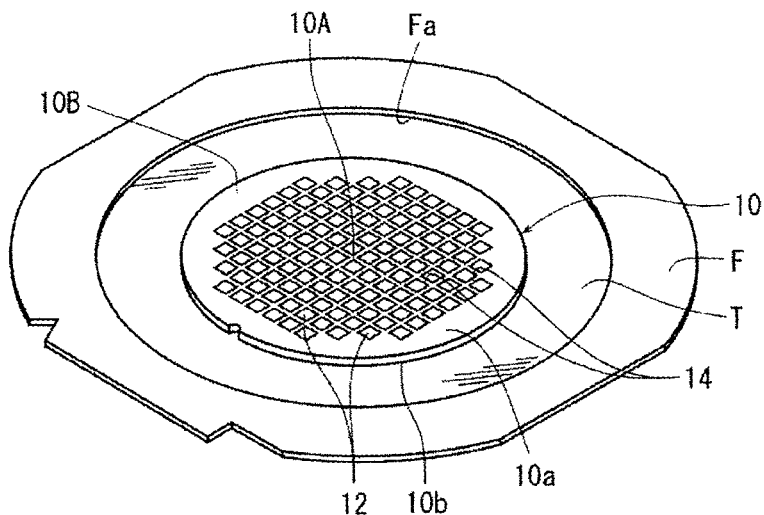
FIG. 1 is a perspective view of a wafer which is a workpiece in an embodiment of the present invention.

A wafer processing method according to embodiments of the present invention will be described in detail below referring to the attached drawings. FIG. 1 depicts a wafer 10 to be processed by the wafer processing method of an embodiment of the present invention. The wafer 10 is provided on a front surface 10a thereof with a device area 10A in which a plurality of devices 12 are partitioned by a plurality of intersecting streets 14, and a peripheral marginal area 10B surrounding the device area 10A. As depicted in FIG. 1, the wafer 10 of the present embodiment is positioned at a center of an opening Fa formed in an annular frame F and is supported by the frame F with a back surface 10b thereof attached to a protective tape T whose periphery is attached to the frame F.

Figure 2:
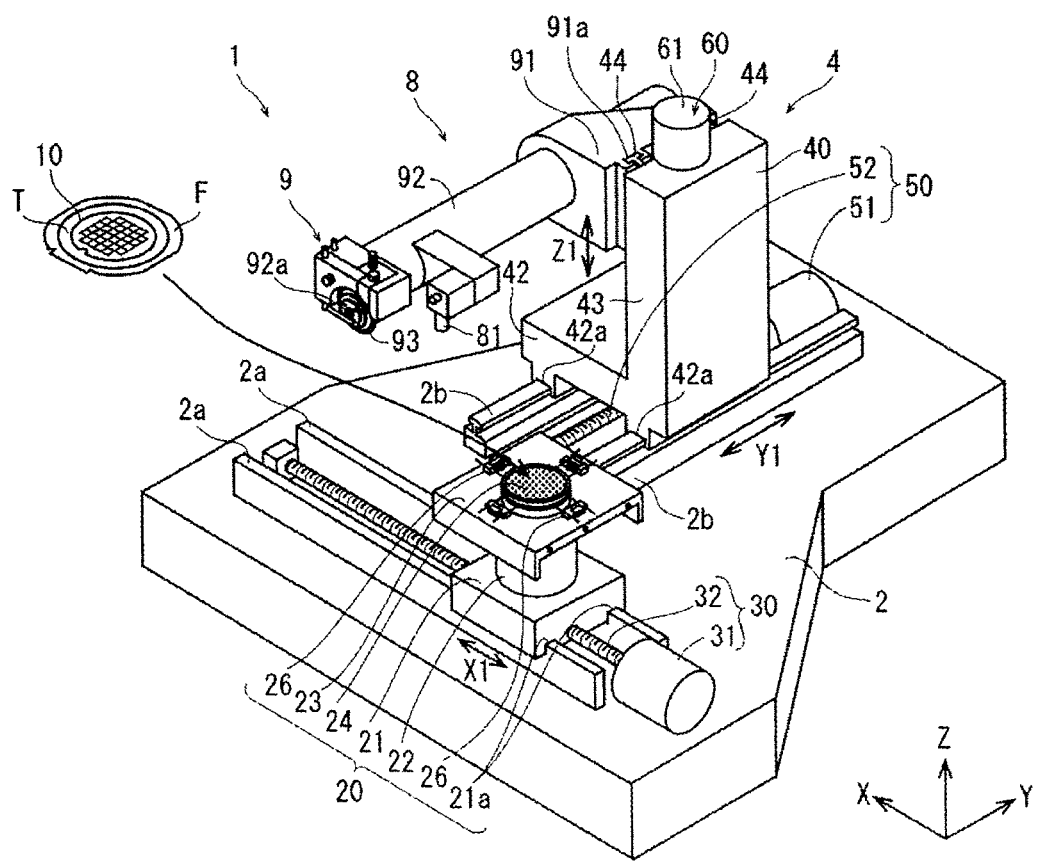
FIG. 2 is a general perspective view of a cutting apparatus suitable for use in a wafer processing method of the embodiment.

FIG. 2 illustrates a perspective view of a cutting apparatus 1 suitable for carrying out the wafer processing method configured based on the present invention. The cutting apparatus 1 of the present embodiment includes a holding unit 20. The holding unit 20 includes a rectangular X-axis direction moving base 21 supported to be movable on a pair of guide rails 2a disposed in parallel to each other in an X-axis direction on a stationary base 2; a cylindrical support member 22 disposed on the X-axis direction moving base 21; a rectangular cover plate 23 covering a periphery of an upper portion of the cylindrical support member 22; a chuck table 24 which is disposed on the cylindrical support member 22 and holds the wafer 10; and clamp mechanisms 26 which are disposed between the cylindrical support member 22 and the chuck table 24 and which clamp the frame F when placing the wafer 10 on the chuck table 24 and holding the wafer 10. A lower surface of the X-axis direction moving base 21 is formed with a pair of guide grooves 21a making slidable contact with the guide rails 2a, and the guide rails 2a and the guide grooves 21a form sliding sections. The chuck table 24 includes a gas-permeable member and is connected to a suction source, omitted in illustration, through the inside of the cylindrical support member 22. With the suction source operated, a suction negative pressure is supplied to a holding surface of the chuck table 24.

The cutting apparatus 1 includes a cutting unit 9 to which a cutting blade 93 provided at a periphery thereof with a cutting edge 93a for cutting the wafer 10 held by the chuck table 24 is mounted; an X-axis feeding mechanism 30 that puts the chuck table 24 and the cutting unit 9 into relative processing feeding in an X-axis direction; a Y-axis feeding mechanism 50 that puts the chuck table 24 and the cutting unit 9 into relative indexing feeding in a Y-axis direction orthogonal to the X-axis direction; and a Z-axis feeding mechanism 60 that puts the chuck table 24 and the cutting unit 9 into relative cutting-in feeding in a Z-axis direction orthogonal to the X-axis direction and the Y-axis direction. Note that, though omitted in illustration, a rotational drive mechanism for rotating the chuck table 24 is disposed inside the cylindrical support member 22, whereby the chuck table 24 can be rotated a desired angle.

The X-axis feeding mechanism 30 converts a rotational motion of a pulse motor 31 into a rectilinear motion and transmits the rectilinear motion to the X-axis direction moving base 21 disposed on the chuck table 24, through a ball screw 32 rotated by the pulse motor 31, and advances and retracts the X-axis direction moving base 21 along the pair of guide rails 2a on the stationary base 2.

A spindle support mechanism 4 disposed to be movable in the Y-axis direction by the Y-axis feeding mechanism 50 is disposed on the stationary base 2. The spindle support mechanism 4 includes a Y-axis direction moving base 40. The Y-axis direction moving base 40 includes a support section 42 supported such as to be movable on a pair of guide rails 2b extending in the Y-axis direction, and a vertical wall section 43 erected on the support section 42. A lower surface of the support section 42 is formed with a pair of guide grooves 42a making slidable contact with the guide rails 2b, and the guide rails 2b and the guide grooves 42a form sliding sections. The Y-axis feeding mechanism 50 converts a rotational motion of a pulse motor 51 into a rectilinear motion and transmits the rectilinear motion to the support section 42, through a ball screw 52 rotated by the pulse motor 51, and advances and retracts the support section 42 along the guide rails 2b in the Y-axis direction on the stationary base 2.

A spindle unit 8 disposed to be movable in the Z-axis direction indicated by an arrow Z by the Z-axis feeding mechanism 60 is mounted to the vertical wall section 43 of the Y-axis direction moving base 40. The spindle unit 8 includes a Z-axis direction moving base 91, a spindle housing 92 supported by the Z-axis direction moving base 91, the cutting unit 9 having the cutting blade 93 which is rotatably supported by the spindle housing 92 and is disposed at a tip portion of a rotary shaft 92a along the Y-axis direction, and imaging means 81 disposed on the spindle housing 92. The cutting blade 93 of the cutting unit 9 is positioned in an X-axis direction at a predetermined position (for example, a central position) in a region imaged by the imaging means 81.

The Z-axis direction moving base 91 is supported to be movable along a pair of guide rails 44 disposed in the Z-axis direction (cutting-in feeding direction) indicated by the arrow Z1 on the vertical wall section 43 of the Y-axis direction moving base 40. The Z-axis direction moving base 91 is provided with a pair of guide grooves 91a (in the figure, only one of them is depicted) making slidable contact with the guide rails 44. The Z-axis direction moving base 91 is moved in the Z-axis direction by a pulse motor 61 of the Z-axis feeding mechanism 60 and a ball screw (omitted in illustration) which converts rotation of the pulse motor 61 into a rectilinear motion and transmits the rectilinear motion to a female screw section formed on the Z-axis direction moving base 91. The pulse motor 61 and the ball screw function as the Z-axis feeding mechanism 60 that puts the holding unit 20 and the cutting unit 9 into relative cutting-in feeding in the Z-axis direction.

Figure 3:
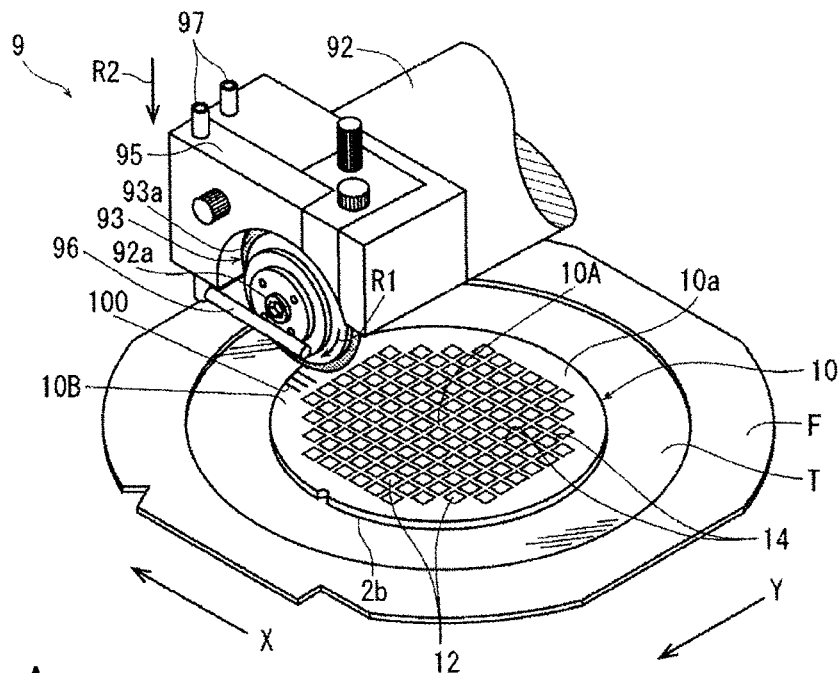
FIG. 3 is a perspective view depicting in an enlarged form a part of the cutting apparatus in the embodiment of a dressing step.

As depicted in FIG. 3, the cutting unit 9 includes the rotary shaft 92a that is disposed at a tip portion of the abovementioned spindle housing 92, that is rotatably held by the spindle housing 92, and that is rotationally driven by an electric motor omitted in illustration; the cutting blade 93 fixed to a tip portion of the rotary shaft 92a; a blade cover 95 that covers the cutting blade 93; a cutting water supply port 97 that supplies cutting water through the blade cover 95; and a cutting water supply nozzle 96 that jets the cutting water to a cutting position by the annular cutting edge 93a of the cutting blade 93.

The cutting apparatus 1 is provided with a control unit omitted in illustration. The control unit includes a computer, which includes a central processing unit (CPU) performing arithmetic processing according to a control program, a read only memory (ROM) that stores a control program and the like, a random access memory (RAM) capable of reading and writing for temporarily storing, for example, detected values and results of calculation, an input interface, and an output interface. The pulse motor 31 of the X-axis feeding mechanism 30, the pulse motor 51 of the Y-axis feeding mechanism 50, the pulse motor 61 of the Z-axis feeding mechanism 60, a rotation drive mechanism that rotates the chuck table 24 and that is omitted in illustration, and the like are connected to the control unit. The chuck table 24 and the cutting blade 93 of the cutting unit 9 can be positioned at desired positions, on the basis of position information detected by position detecting means for detecting the positions in the X-axis direction and a rotating direction of the chuck table 24 and position detecting means for detecting the positions in the Y-axis direction and the Z-axis direction of the cutting blade 93 of the cutting unit 9.

The cutting apparatus 1 is generally configured as above-described, and the wafer processing method of the present embodiment which is carried out using the cutting apparatus 1 will be described below.

When performing the wafer processing method of the present embodiment, a preparing step of preparing the abovementioned cutting apparatus 1 is carried out. It is sufficient that the cutting apparatus prepared in the preparing step is a cutting apparatus that includes the chuck table 24 that holds the wafer 10; the cutting unit 9 to which the cutting blade 93 provided at the periphery thereof the cutting edge 93a for cutting the wafer 10 held by the chuck table 24 is rotatably mounted; the X-axis feeding mechanism 30 that puts the chuck table 24 and the cutting unit 9 into relative processing feeding in the X-axis direction; the Y-axis feeding mechanism 50 that puts the chuck table 24 and the cutting unit 9 into relative indexing feeding in the Y-axis direction orthogonal to the X-axis direction; and the Z-axis feeding mechanism 60 that puts the cutting unit 9 in the cutting-in feeding in the Z-axis direction orthogonal to the X-axis direction and the Y-axis direction, as described above. The other configurations are not limited to the abovementioned cutting apparatus 1.

Next, as depicted in FIG. 2, a holding step of holding the wafer 10 by the chuck table 24 is carried out. In the holding step, the wafer 10 is mounted on the chuck table 24 through the protective tape T, the wafer 10 is held under suction in situ by operating a suction source omitted in illustration, and the frame F is fixed by the clamp mechanisms 26.

Subsequently, a dressing step of cutting the peripheral marginal area 10B of the wafer 10 by the cutting blade 93 mounted to the cutting unit 9 to condition the state of the cutting edge 93a is conducted. This dressing step can be carried out based on position information concerning the peripheral marginal area 10B of the wafer 10 which is preliminarily stored in the abovementioned control unit. However, the present invention is not limited to this; for example, before performing the dressing step, the X-axis feeding mechanism 30 and the Y-axis feeding mechanism 50 may be operated to position the chuck table 24 directly below the imaging means 81, the wafer 10 held by the chuck table 24 may be imaged, and the position information concerning the peripheral marginal area 10B of the wafer 10 may be detected.

A specific embodiment of the dressing step will be described below referring to FIGS. 3 to 5C. Note that FIGS. 3 to 5C depict the state in which the wafer 10 is held by the chuck table 24, for convenience's sake, the chuck table 24 and other configurations are omitted.

When the dressing step is carried out, first, the cutting unit 9 is operated to rotate the cutting blade 93 in the direction indicated by an arrow R1. Next, based on the position information concerning the peripheral marginal area 10B of the wafer 10 which is stored in the control unit, the X-axis feeding mechanism 30 and the Y-axis feeding mechanism 50 are operated to relatively move the chuck table 24 and the cutting unit 9, thereby positioning the cutting unit 9 on the protective tape T on the outside of the peripheral marginal area 10B of the wafer 10. Subsequently, the pulse motor 61 of the Z-axis feeding mechanism 60 is operated to lower the cutting blade 93 (indicated by solid line) in the direction indicated by an arrow R2 in FIG. 4A. In this instance, the lower end position of the cutting blade 93 lowered is set to a height of the surface of the protective tape T or a position slightly higher than the height thereof. After the cutting blade 93 is lowered, the wafer 10 is moved in the direction indicated by an arrow X, and the cutting blade 93 is caused to cut (indicated by alternate long and two short dashes line) into the peripheral marginal area 10B from the peripheral end of the wafer 10, thereby forming a cut-in groove 100 as depicted in FIG. 3.

Figure 5A:
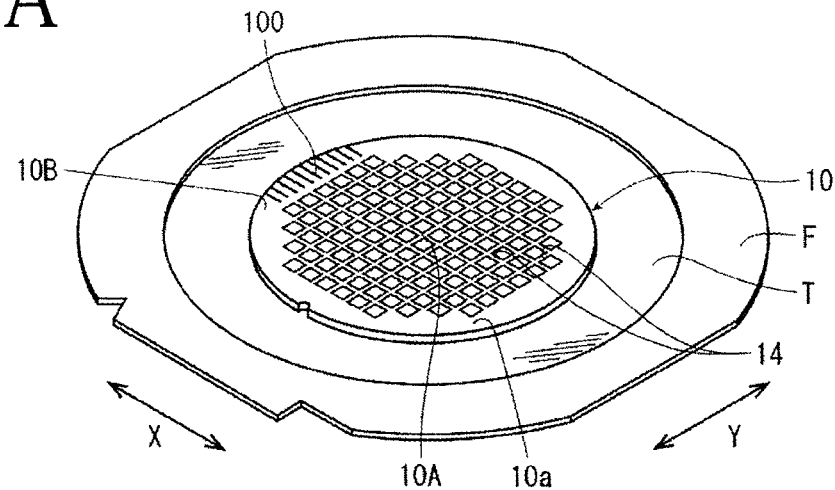
FIG. 5A is a perspective view of the wafer having undergone the dressing step depicted in FIG. 3.

After the abovementioned cut-in groove 100 is formed, the Z-axis feeding mechanism 60 is operated to raise the cutting blade 93, and the X-axis feeding mechanism 30 is operated to move the wafer 10 in the X-axis direction, to position the cutting blade 93 on the protective tape T on the outside of the peripheral marginal area 10B of the wafer 10. Then, the Y-axis feeding mechanism 50 is operated to put the wafer 10 and the cutting unit 9 into relative indexing feeding in the Y-axis direction, thereby positioning the cutting blade 93 at a position adjacent to the cut-in groove 100 previously formed. Then, similarly to the abovementioned, the cutting blade 93 is lowered, and the wafer 10 is moved in the X-axis direction, to form a new cut-in groove 100. Such formation of the cut-in groove 100 is repeated until the cutting edge 93a is conditioned, and, as depicted in FIG. 5A, a plurality of cut-in grooves 100 are formed. Thus, in the peripheral marginal area 10B where the devices 12 are not formed, the cutting blade 93 is made to cut in for a predetermined length, whereby a film laminated on the front surface 10a of the device area 10A and elements called thermoelectric generators (TEGs) formed on the streets 14 and the like are not cut in, so that the state of the cutting edge 93a is conditioned, and the cutting edge 93a is dressed. Note that, in the case where the plurality of cut-in grooves 100 are formed in the direction along the predetermined streets 14 as depicted in FIG. 5A, it is preferable to form the cut-in grooves 100 while avoiding the areas on extensions of the streets 14. As a result, in a dividing step to be carried out later, when cutting along the streets 14, a situation that the cut-in grooves 100 previously formed would hinder the progress of the cutting blade 93 is avoided.

Figure 4A:
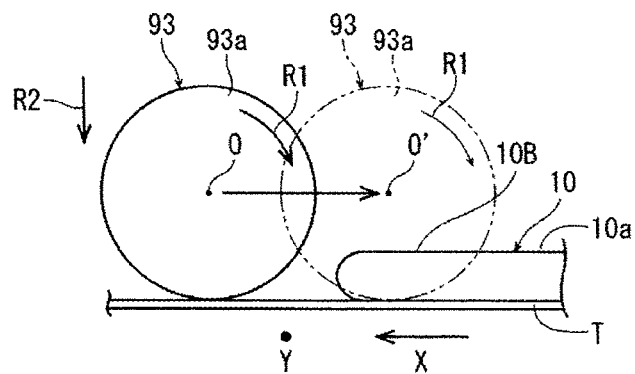
FIG. 4A is a side view of the dressing step depicted in FIG. 3.
Figure 4B:
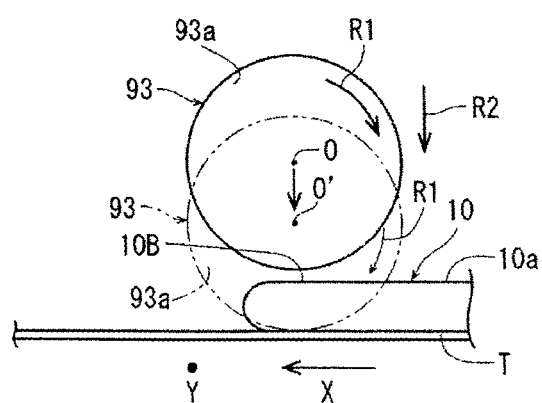
FIG. 4B is a side view depicting another embodiment of the dressing step depicted in FIG. 4A.

Note that, in the dressing step described above, the cutting blade 93 is positioned on the protective tape T on the outside of the peripheral marginal area 10B of the wafer 10, and, while the wafer 10 is moved in the X-axis direction, the cutting blade 93 is made to cut in in a horizontal direction, to form the cut-in groove 100 in the peripheral marginal area 10B of the wafer 10. However, for example, as depicted in FIG. 4B, the cutting blade 93 may be positioned on the peripheral marginal area 10B of the wafer 10, the cutting unit 9 may be operated to rotate the cutting blade 93 in the direction indicated by the arrow R1, and the cutting blade 93 may be put into cutting-in feeding in the Z-axis direction indicated by the arrow R2, and the cutting blade 93 may be made to vertically cut into the peripheral marginal area 10B from above to form the cut-in groove 100, to condition the cutting edge 93a. In this case, also, it is preferable to form a plurality of cut-in grooves 100 in the peripheral marginal area 10B while operating the Y-axis feeding mechanism 50 to put the wafer 10 and the cutting unit 9 into relative indexing feeding in the Y-axis direction.

Figure 5B:
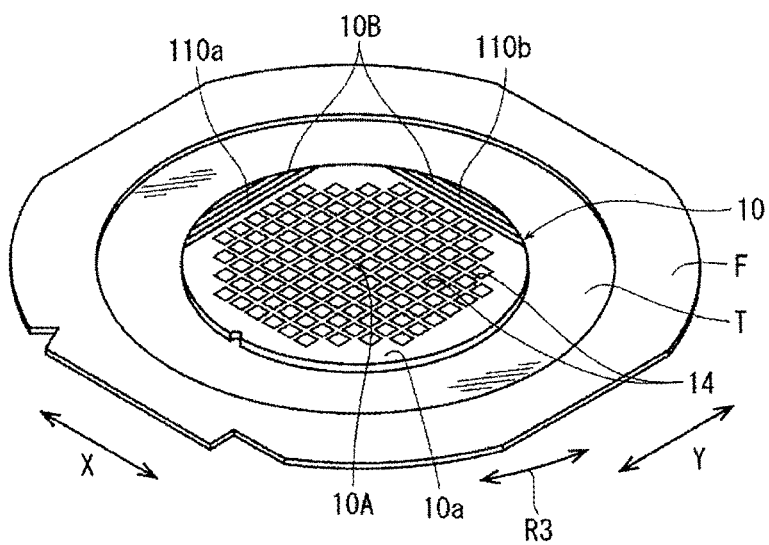
FIG. 5B is a perspective view of the wafer having undergone the dressing step according to the another embodiment.

In addition, the dressing step of the present invention is not limited to the abovementioned embodiment. For example, as depicted in FIG. 5B, in the peripheral marginal area 10B of the wafer 10, cutting by the cutting blade 93 may be performed such as to form a chord connecting two points on the peripheral edge of the wafer 10, and preferably, a plurality of cut-in grooves 110a parallel to the chord may be formed, thereby conditioning the state of the cutting edge 93a. Further, in order to condition the state of the cutting edge 93a more favorably, the wafer 10 may be rotated by 90 degrees in the direction indicated by an arrow R3 in the figure, the cutting blade 93 may be positioned on the adjacent peripheral marginal area 10B, and cutting by the cutting blade 93 may be performed such as to form a chord connecting two points on the peripheral edge of the wafer 10, thereby forming a plurality of cut-in grooves 110b.

Figure 5C:
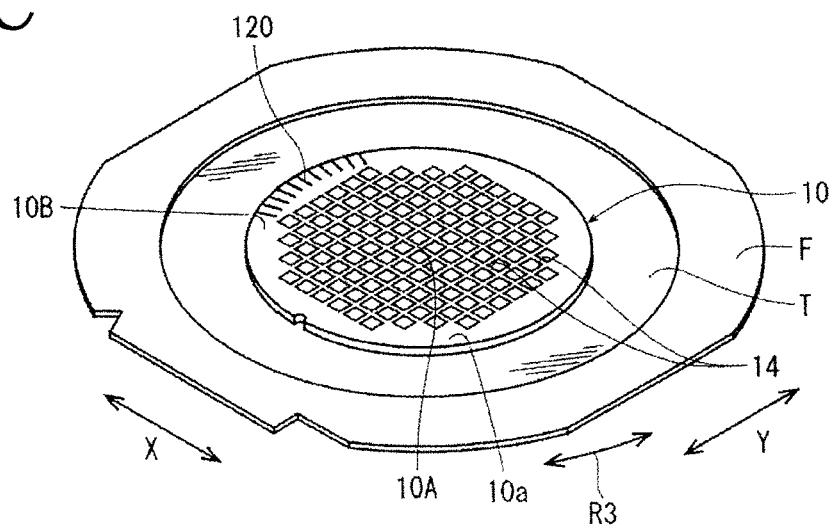
FIG. 5C is a perspective view of the wafer having undergone the dressing step according to a further embodiment.

Further, as depicted in FIG. 5C, in the peripheral marginal area 10B of the wafer 10, a plurality of cut-in grooves 120 may be formed radially. When such cut-in grooves 120 are formed, the X-axis feeding mechanism 30 and the Z-axis feeding mechanism 60 are operated to cause the cutting blade 93 to cut into the peripheral marginal area 10B of the wafer 10 in the X-axis direction (horizontal direction) or the Z-axis direction (vertical direction) to form the cut-in groove 120, and the rotational drive mechanism (omitted in illustration) of the chuck table 24 is operated to gradually rotate the wafer 10 in the direction indicated by the arrow R3, whereby a plurality of cut-in grooves 120 are formed radially and thereby the dressing step can be carried out.

After the dressing step is conducted, a dividing step is carried out in which the cutting unit 9 is operated, and the X-axis feeding mechanism 30, the Y-axis feeding mechanism 50, and the Z-axis feeding mechanism 60 are operated to cut all the streets 14 of the wafer 10 by the cutting blade 93 mounted to the cutting unit 9, thereby dividing the devices 12 of the wafer 10 into individual device chips.

According to the present embodiment, in the wafer processing method, even in the case of performing the dressing step for conditioning the state of the cutting edge 93a, it is unnecessary to prepare a dummy wafer, and, further, it is unnecessary to re-place the wafer due to carrying out of the dressing step, so that productivity is enhanced.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer formed on a front surface thereof with a device area in which a plurality of devices are partitioned by a plurality of intersecting streets and a peripheral marginal area surrounding the device area into individual device chips, the wafer processing method comprising:
    a preparing step of preparing a cutting apparatus including a chuck table that holds the wafer, a cutting unit to which a cutting blade provided at a periphery thereof with a cutting edge for cutting the wafer held by the chuck table is rotatably mounted, an X-axis feeding mechanism that puts the chuck table and the cutting unit into relative processing feeding in an X-axis direction, a Y-axis feeding mechanism that puts the chuck table and the cutting unit into relative indexing feeding in a Y-axis direction orthogonal to the X-axis direction, and a Z-axis feeding mechanism that puts the cutting unit into cutting-in feeding in a Z-axis direction orthogonal to the X-axis direction and the Y-axis direction;
    a holding step of holding the wafer on the chuck table;
    a dressing step of cutting the peripheral marginal area by the cutting blade mounted to the cutting unit, to condition a state of the cutting edge, after the holding step is carried out, wherein the dressing step results in the formation of a plurality of cut-in grooves within the peripheral marginal area that do not extend into the device area; and
    a dividing step of cutting the streets by the cutting blade mounted to the cutting unit, to divide the wafer into the individual device chips.

2. The wafer processing method according to claim 1, wherein, in the dressing step, the cutting unit is put into cutting-in feeding in the Z-axis direction to vertically cut into the peripheral marginal area, thereby conditioning the cutting edge of the cutting blade.

3. The wafer processing method according to claim 1, wherein the cut-in grooves are only formed in areas between adjacent ones of the intersecting streets.

4. The wafer processing method according to claim 1, wherein the cut-in grooves each comprise a chord that is completely formed within the peripheral marginal area.

5. The wafer processing method according to claim 4, wherein said cut-in grooves are parallel to each other.

6. The wafer processing method according to claim 1, wherein the cut-in grooves comprise:
    a first set of chords that are each completely formed within a first portion of the peripheral marginal area; and
    a second set of chords that are each completely formed within a second portion of the peripheral marginal area, and
    wherein the second set of chords are formed after the wafer has been rotated by 90 degrees.

7. The wafer processing method according to claim 6, wherein the second set of chords are perpendicular to the first set of chords.

8. The wafer processing method according to claim 1, wherein the plurality of cut-in grooves each extend radially inwardly from the outer edge of the wafer.

9. The wafer processing method according to claim 1, wherein the plurality of cut-in grooves each extend in a radial direction with respect to the wafer.

10. The wafer processing method according to claim 9, wherein the plurality of cut-in grooves each extend in an oblique direction with respect to the intersecting streets.

11. A wafer processing method for dividing a wafer formed on a front surface thereof with a device area in which a plurality of devices are partitioned by a plurality of intersecting streets and a peripheral marginal area surrounding the device area into individual device chips, the wafer processing method comprising:
    a preparing step of preparing a cutting apparatus including a chuck table that holds the wafer, a cutting unit to which a cutting blade provided at a periphery thereof with a cutting edge for cutting the wafer held by the chuck table is rotatably mounted, an X-axis feeding mechanism that puts the chuck table and the cutting unit into relative processing feeding in an X-axis direction, a Y-axis feeding mechanism that puts the chuck table and the cutting unit into relative indexing feeding in a Y-axis direction orthogonal to the X-axis direction, and a Z-axis feeding mechanism that puts the cutting unit into cutting-in feeding in a Z-axis direction orthogonal to the X-axis direction and the Y-axis direction;
    a holding step of holding the wafer on the chuck table;
    a dressing step of cutting the peripheral marginal area by the cutting blade mounted to the cutting unit, to condition a state of the cutting edge, after the holding step is carried out, wherein the dressing step results in at least one cut-in groove that extends radially inwardly from an outer peripheral edge of the wafer, and further wherein the at least one cut-in groove extends in an oblique direction with respect to the intersecting streets; and a dividing step of cutting the streets by the cutting blade mounted to the cutting unit, to divide the wafer into the individual device chips.

12. A wafer processing method for dividing a wafer formed on a front surface thereof with a device area in which a plurality of devices are partitioned by a plurality of intersecting streets and a peripheral marginal area surrounding the device area into individual device chips, the wafer processing method comprising:

a preparing step of preparing a cutting apparatus including a chuck table that holds the wafer, a cutting unit to which a cutting blade provided at a periphery thereof with a cutting edge for cutting the wafer held by the chuck table is rotatably mounted, an X-axis feeding mechanism that puts the chuck table and the cutting unit into relative processing feeding in an X-axis direction, a Y-axis feeding mechanism that puts the chuck table and the cutting unit into relative indexing feeding in a Y-axis direction orthogonal to the X-axis direction, and a Z-axis feeding mechanism that puts the cutting unit into cutting-in feeding in a Z-axis direction orthogonal to the X-axis direction and the Y-axis direction;

a holding step of holding the wafer on the chuck table;

a first dressing step of cutting the peripheral marginal area by the cutting blade mounted to the cutting unit, to condition a state of the cutting edge, after the holding step is carried out, wherein the first dressing step results in at least one first chord that is completely formed within the peripheral marginal area;

a rotating step of rotating the wafer by 90 degrees;

a second dressing step of cutting the peripheral marginal area by the cutting blade mounted to the cutting unit, to condition a state of the cutting edge, after the rotating step is carried out, wherein the second dressing step results in at least one second chord that is completely formed within the peripheral marginal area; and a dividing step of cutting the streets by the cutting blade mounted to the cutting unit, to divide the wafer into the individual device chips.

13. The wafer processing method according to claim 12, wherein:

the at least one first chord comprises a plurality of first chords; and the at least one second chord comprises a plurality of second chords.

14. The wafer processing method according to claim 13, wherein the second chords are perpendicular to first chords.

15. The wafer processing method according to claim 1, wherein the devices formed in the device area comprise integrated circuits.

16. The wafer processing method according to claim 11, wherein the devices formed in the device area comprise integrated circuits.

17. The wafer processing method according to claim 12, wherein the devices formed in the device area comprise integrated circuits.

18. The wafer processing method according to claim 1, wherein the cut-in grooves are only formed in areas avoiding extensions of each of the streets.

19. The wafer processing method according to claim 11, wherein the cut-in grooves are only formed in areas avoiding extensions of each of the streets.

* * * * *